United States Patent
Hode (10) Patent No.: US 10,598,765 B2
(45) Date of Patent: Mar. 24, 2020

(54) METHOD FOR FILTERING A NUMERICAL INPUT SIGNAL AND ASSOCIATED FILTER

(71) Applicant: THALES, Courbevoie (FR)

(72) Inventor: Jean-Michel Hode, Pessac (FR)

(73) Assignee: THALES, Courbevoie (FR)

( * ) Notice: Subject to any disclaimer, the term of this patent is extended or adjusted under 35 U.S.C. 154(b) by 353 days.

(21) Appl. No.: 15/458,222

(22) Filed: Mar. 14, 2017

(65) Prior Publication Data

US 2017/0269192 A1    Sep. 21, 2017

(30) Foreign Application Priority Data

Mar. 18, 2016 (FR) .................................... 16 00454

(51) Int. Cl.
*G01S 7/292* (2006.01)
*H03H 17/02* (2006.01)
*H03H 17/00* (2006.01)

(52) U.S. Cl.
CPC ......... *G01S 7/292* (2013.01); *H03H 17/0213* (2013.01)

(58) Field of Classification Search
CPC .......... H03H 17/0072; H03H 17/0081; H03H 17/009; H03H 17/0213; H03H 17/0214; H03H 17/0248; H03H 17/0202; H03H 17/0298; G01S 7/295; G01S 7/352; G01S 2007/356; G01S 2013/0236; G01S 13/006; G01S 13/9094; G01S 13/958; G01S 7/292; G01S 7/285; G06F 17/00; G06F 17/10; G06F 17/14; G06F 17/142; G06F 17/144; G06F 17/141
See application file for complete search history.

(56) References Cited

U.S. PATENT DOCUMENTS 4,412,325 A * 10/1983 Molo ........................ H04J 1/05
                                                             370/210
4,792,943 A * 12/1988 Gockler ............. H03H 17/0213
                                                             370/210

(Continued)

FOREIGN PATENT DOCUMENTS

| EP | 2144172 A1 | 1/2010 |
|----|------------|--------|
| JP | 2010127645 A | 6/2010 |
| WO | 2007100666 A2 | 9/2007 |

OTHER PUBLICATIONS

FR Search Report, dated Jan. 31, 2017, from corresponding FR application.

*Primary Examiner* — Bernarr E Gregory
(74) *Attorney, Agent, or Firm* — Young & Thompson (57) ABSTRACT

A signal filtering method for filtering a numerical input signal that is sampled at a sampling frequency in order to obtain a filtered signal, the method including a first operation of application of a discrete Fourier transform to M points on a processed signal in order to obtain M points of the spectrum of the processed signal, each point of the spectrum of the processed signal corresponding to the even-numbered indices of a spectral analysis at 2*M points of the processed signal; and a second operation of application of a discrete Fourier transform to M points on the processed signal in order to obtain M points of the spectrum of the processed signal, each point of the spectrum of the processed signal corresponding to the odd-numbered indices of a spectral analysis at 2*M points of the processed signal.

10 Claims, 2 Drawing Sheets

(56) References Cited

U.S. PATENT DOCUMENTS

| | | | |
|---|---|---|---|
| 4,992,967 A * | 2/1991 | Auvray | H03H 17/02 |
| | | | 708/321 |
| 5,270,953 A | 12/1993 | White | |
| 6,324,559 B1 | 11/2001 | Hellberg | |
| 2006/0140291 A1* | 6/2006 | Thomas, Jr. | H04L 27/265 |
| | | | 375/260 |
| 2008/0126461 A1* | 5/2008 | Christoph | H03H 17/0213 |
| | | | 708/403 |
| 2010/0178894 A1* | 7/2010 | Romain | G01S 7/352 |
| | | | 455/339 |
| 2010/0235419 A1 | 9/2010 | Yamamoto | |
| 2011/0270901 A1 | 11/2011 | Dobart et al. | |
| 2012/0288034 A1* | 11/2012 | Fireaizen | G01R 29/0273 |
| | | | 375/340 |

\* cited by examiner

METHOD FOR FILTERING A NUMERICAL INPUT SIGNAL AND ASSOCIATED FILTER

FIELD OF THE INVENTION

This patent application claims the benefit of document FR 16 00454 filed Mar. 18, 2016 on which is hereby incorporated by reference.

The present invention relates to a signal filtering method for filtering a numerical input signal. The present invention also relates to a filter, a processing chain and an associated radar.

BACKGROUND OF THE INVENTION

For multiple applications in the field of radars, it is desirable to filter a digitized signal with a specific transfer function.

In order to do this, use is made of transversal-type finite impulse response filters. Such filters are often referred to by the acronym FIR that is derived from the term "Finite Impulse Response" as per the accepted English terminology. FIR filters effectively implement operations that include the use of time shifts of the signal, of gains and summation. The number of operations is equal to the length of the impulse response of the FIR filter being considered (with the length being expressed in number of samples).

However, when the length of the impulse response of the filter is very large, as is the case for the pulse compression that is involved in the radars, the process of carrying out the filtering becomes problematic or even impossible in view of the very large number of operations involved.

In order to work around such a problem, it is a known practice to perform some operation in the space of frequencies. For this, a Fourier transformation is applied in order to pass from the domain of time to the domain of frequencies, with the filter operation thus then becoming multiplicative, then a Fourier transformation is subsequently applied so as to return into the domain of time.

In practice, the time is divided into sequences and the Fourier transformation is effectively implemented by means of a fast Fourier transform often referred to by the abbreviation FFT for the accepted term "Fast Fourier Transform". More precisely, the passage from the domain of the time space to the frequency space is obtained through the use of a FFT while the passage from the domain of the frequency space to the time space is obtained through the use of an IFFT. The abbreviation IFFT refers to the term "Inverse Fast Fourier Transform" as per the accepted terminology.

The use of Fourier Transforms, whether inverse fast FT or not, entails a size that is at least equal to the length of the filter. In fact, if the size of the Fourier transform, whether inverse fast FT or not, is strictly equal to the size K of the filter, then the process makes it possible to obtain only one single point on K, with the K-1 other points calculated not being usable. If the size of the Fourier Transform, whether inverse fast FT or not, is strictly equal to two times the size K of the filter, that is to say 2K, then the process makes it possible to obtain K points on 2K, with the K other points calculated not being usable. Thus, by doubling the process, it is possible to calculate 2 times K points on 2K and to access all of the required points.

However, this shows that half of the points calculated will be lost, which increases the computational load and complicates the operational implementation of the filter.

SUMMARY OF THE INVENTION

There is therefore a need for a signal filtering method for filtering a numerical input signal that provides for easier implementation.

To this end, this document provides a description of a signal filtering method for filtering a numerical input signal that is sampled at a sampling frequency in order to obtain a filtered signal, the method including the provision of an input signal, the transmission of the input signal over two channels, the obtaining of a first output signal through the implementation of the following first operations on the first channel, and the obtaining of a second output signal through the implementation of the following second operations on the second channel. The obtaining of a first output signal through the implementation of the following first operations on the first channel: a first operation of first processing of the input signal in order to obtain a processed signal a first operation of application of a discrete Fourier transform to M points on the processed signal in order to obtain M points of the spectrum of the processed signal, M being an integer that is strictly greater than 2, each point of the spectrum of the processed signal corresponding to the even-numbered indices of a spectral analysis at 2*M points of the processed signal and being indicated in a bijective manner by an index k, with k being an even number occurring between 0 and 2*M-1 a first operation of second processing of the points of the spectrum of the processed signal in order to obtain the first selected points a first operation of application of the inverse discrete Fourier transform to M points on the first selected points in order to obtain a first signal and a first operation of third processing of the first signal in order to obtain a first output signal. The obtaining of a second output signal through the implementation of the following second operations on the second channel: a second operation of first processing of the input signal in order to obtain a processed signal a second operation of application of a discrete Fourier transform to M points on the processed signal in order to obtain M points of the spectrum of the processed signal, M being an integer that is strictly greater than 2, each point of the spectrum of the processed signal corresponding to the odd-numbered indices of a spectral analysis at 2*M points of the processed signal and being indicated in a bijective manner by an index k, with k being an odd number occurring between 0 and 2*M-1 a second operation of second processing of the points of the spectrum of the processed signal in order to obtain the second selected points a second operation of application of the inverse discrete Fourier transform to M points on the second selected points in order to obtain a second signal and a second operation of third processing of the second signal in order to obtain a second output signal. The method also includes the recombination of the first output signal and the second output signal in order to obtain the filtered signal.

According to the particular embodiments, the method includes one or more of the following characteristic features, taken into consideration in isolation or in accordance with all technically possible combinations:

the second operation of first processing includes the carrying out of a frequency translation of a value equal to the ratio between the frequency of sampling and the number 2*M and the second operation of third processing includes the carrying out of a frequency translation applied to the second signal of a value equal to the opposite of the ratio between the frequency of sampling and the number 2*M.

the first operation of second processing includes the implementation of the shifting of points of the spectrum of the processed signal by M samples in order to obtain shifted points and the calculation of the sum of points of the spectrum of the processed signal and the shifted points and the second operation of second processing includes the implementation of the shifting of points of the spectrum of the processed signal by M samples in order to obtain shifted points and the calculation of the sum of points of the spectrum of the processed signal and the shifted points.

the first operation of first processing includes the implementation of the shifting of the input signal by M samples in order to obtain a shifted signal and the calculation of the sum of the input signal and the shifted signal and the second operation of first processing includes the implementation of the shifting of the input signal by M samples in order to obtain a shifted signal and the calculation of the difference between the input signal and the shifted signal.

the step of recombination is carried out by calculation of the difference between the first output signal and the second output signal.

the step of recombination is carried out by calculation of the difference between the first output signal and the second output signal, in order to obtain a first calculation signal calculation of the sum of the first output signal and the second output signal, in order to obtain a second intermediate calculation signal,—shifting of the second intermediate calculation signal by M samples in order to obtain a second calculation signal and calculation of the sum of the first calculation signal and the second calculation signal in order to obtain the filtered signal.

Also described herein is a filter that is capable of filtering a numerical input signal that is sampled at a sampling frequency in order to obtain a filtered signal, the filter including an input terminal that is capable of receiving an input signal, a first channel that is capable of obtaining a first output signal through the implementation of the first operations, a second channel that is capable of obtaining a second output signal through the implementation of the second operations, a transmitter that is capable of transmitting the input signal on the first channel and the second channel, a mixer that is capable of recombining the first output signal and the second output signal in order to obtain the filtered signal, the first channel being capable of implementing the following first operations: a first operation of first processing of the input signal in order to obtain a processed signal a first operation of application of a discrete Fourier transform to M points on the processed signal in order to obtain M points of the spectrum of the processed signal, M being an integer that is strictly greater than 2, each point of the spectrum of the processed signal corresponding to the even-numbered indices of a spectral analysis at 2*M points of the processed signal and being indicated in a bijective manner by an index k, with k being an even number occurring between 0 and 2*M−1 a first operation of second processing of the points of the spectrum of the processed signal in order to obtain the first selected points a first operation of application of the inverse discrete Fourier transform to M points on the first selected points in order to obtain a first signal and a first operation of third processing of the first signal in order to obtain a first output signal. The second channel is capable of implementing the following second operations: a second operation of first processing of the input signal in order to obtain a processed signal a second operation of application of a discrete Fourier transform to M points on the processed signal in order to obtain M points of the spectrum of the processed signal, M being an integer that is strictly greater than 2, each point of the spectrum of the processed signal corresponding to the odd-numbered indices of a spectral analysis at 2*M points of the processed signal and being indicated in a bijective manner by an index k, with k being an odd number occurring between 0 and 2*M−1 a second operation of second processing of the points of the spectrum of the processed signal in order to obtain the second selected points a second operation of application of the inverse discrete Fourier transform to M points on the second selected points in order to obtain a second signal and a second operation of third processing of the second signal in order to obtain a second output signal.

The description also pertains to a processing chain that comprises at least one filter as has been previously described.

According to some particular embodiments, the processing chain includes one or more of the following characteristic features, taken into consideration in isolation or in accordance with all technically possible combinations:

the processing chain is a programmable logic circuit.

the processing chain is an application-specific integrated circuit.

In addition, also described herein is a radar that includes a processing chain as has been previously described.

BRIEF DESCRIPTION OF THE DRAWINGS

Other characteristic features and advantages of the invention will become apparent upon reviewing the description that follows of embodiments of the invention, provided by way of example only and with reference being made to the drawings, which include.

DETAILED DESCRIPTION OF THE PREFERRED EMBODIMENTS

Figure 1:
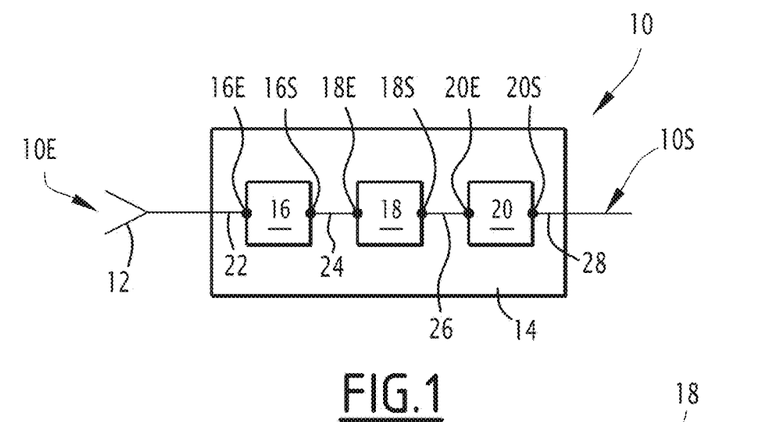
FIG. 1, a schematic view of an example of a radar including a plurality of filters FIG. 2, a block diagram showing the operations carried out by an example of a filter.

A radar 10 is schematically illustrated in FIG. 1.

The radar 10 is capable of receiving an input signal 10E and of converting the input signal 10E into an output signal 10S that may be exploited for future uses.

The radar 10 includes an antenna 12 and a processing chain 14.

The antenna 12 is capable of receiving the input signal 10E.

The processing chain 14 is capable of ensuring the conversion of the input signal 10E into the output signal 10S.

The processing chain 14 is capable of carrying out the filtering of the input signal 10E.

According to the example shown in FIG. 1, the processing chain 14 includes three filters 16, 18 and 20 arranged in series.

In fact, the first 16 filter includes an input terminal 16E connected to the antenna 12 by a first wire 22 and an output terminal 16S connected to the second filter 18 by a second wire 24.

The second filter 18 includes an input terminal 18E connected to the output terminal 16S of the first filter 16 by the second wire 24 and an output terminal 18S connected to the third filter 20 by a third wire 26.

The third filter 20 includes an input terminal 20E connected to the output terminal 18S of the second filter 18 by the third wire 26 and an output terminal 20S connected to the fourth wire 28 that transmits the output signal 10S.

According to another embodiment, the processing chain 14 includes a single filter.

By way of a variant, the processing chain 14 includes any number whatsoever of filters, for example 2, 4 or 6.

The processing chain 14 is, for example, a programmable logic circuit. Such a circuit is often referred to by the abbreviation FPGA, abbreviating the commonly accepted term "field-programmable gate array", gate array that is capable of being reprogrammed in the field after manufacture.

According to another example, the processing chain 14 is an integrated circuit specific to a given application. Such a circuit is often referred to by the acronym ASIC (abbreviating the commonly accepted term "application-specific integrated circuit", meaning "an integrated circuit specific to a given application").

Each filter 16, 18 and 20 is capable of filtering a numerical input signal that is sampled at a sampling frequency in order to obtain a filtered signal.

To simplify the description, it is assumed that the filters 16, 18 and 20 are identical to each other.

By way of a variant, each filter in the processing chain 14 is different.

Figure 2:
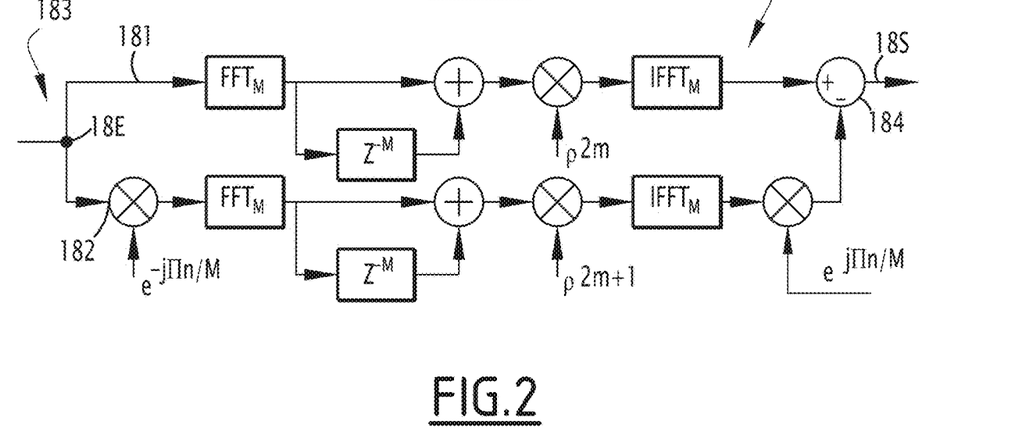

An example of a second filter 18 is more precisely illustrated in FIG. 2.

The filter 18 includes a first channel 181, a second channel 182, a transmitter 183 and 184 a mixer.

The input terminal 18E is capable of receiving an input signal.

The first channel 181 is capable of obtaining a first output signal through the implementation of the first operations.

The first channel 181 is capable of carrying out a first operation of first processing of the input signal in order to obtain a processed signal.

According to the example represented in FIG. 2, the first processing is the sending of the input signal.

The first channel 181 is also capable of applying a discrete Fourier transform to M points on the processed signal in order to obtain M points of the spectrum of the processed signal, M being an integer that is strictly greater than 2, each point of the spectrum of the processed signal corresponding to the even-numbered indices of a spectral analysis at 2*M points of the processed signal and being indicated in a bijective manner by an index k, with k being an even number occurring between 0 and 2*M−1. In this case, the points are numbered from 0 to 2*M−1.

This amounts to calculating the even-numbered coefficients from the spectral analysis at 2*M points of the processed signal.

For example, the discrete Fourier transform computed is a noted fast Fourier transform denoted as $FFT_M$. This is illustrated schematically in FIG. 2 by a box in which $FFT_M$ is inscribed and by a multiplier on which is shown an incoming arrow arriving with the inscription "ρ2 m".

The first channel 181 is also capable of carrying out a first operation of second processing of the points of the spectrum of the processed signal in order to obtain the first selected points.

The first channel 181 is capable of carrying out the shifting of points of the spectrum of the processed signal by M samples in order to obtain shifted points and the calculation of the sum of points of the spectrum of the processed signal and the shifted points.

The shifting is illustrated schematically in FIG. 2 by a box in which "$z^M$" is inscribed by way of reference to a technique of shifting by use of the Z transform.

A sum sign on which two incoming arrows are shown arriving, one corresponding to a path that passes through the box in which "$z^M$" is inscribed and the other corresponding to a path that does not pass there-through schematically shows the first operation of second processing.

The first channel 181 is also capable of carrying out a first operation of application of the inverse discrete Fourier transform to M points on the first selected points in order to obtain a first signal.

For example, the discrete Fourier transform computed is a Fast Fourier transform denoted as $IFFT_M$.

This is illustrated schematically in FIG. 2 by a box in which $IFFT_M$ is inscribed.

The first channel 181 is also capable of carrying out a first operation of third processing of the first signal in order to obtain a first output signal.

In this case, the first operation of the third processing consists of transmitting the first output signal to the mixer 184.

The second channel 182 is capable of obtaining a second output signal through the implementation of second operations.

The second channel 182 is capable of implementing a second operation of first processing of the input signal in order to obtain a processed signal.

In this case, the second channel 182 is capable of implementing a frequency translation of a value equal to the ratio between the frequency of sampling and the number 2*M.

Such an operation is symbolized by an arrow on a multiplier, this being an arrow on which is inscribed "$e^{-j\pi n/M}$" by way of reference to a commonly used translation technique that consists of multiplying the signal by a complex exponential that is appropriately chosen.

The second channel 182 is capable of implementing a second operation of application of a discrete Fourier transform to M points on the processed signal in order to obtain M points of the spectrum of the processed signal, each point of the spectrum of the processed signal corresponding to the odd-numbered indices of a spectral analysis at 2*M points of the processed signal and being indicated in a bijective manner by an index k, with k being an odd number occurring between 0 and 2*M−1.

The second channel 182 is capable of implementing a second operation of second processing of the points of the spectrum of the processed signal in order to obtain the second selected points.

The second channel 182 is capable of carrying out the shifting of points of the spectrum of the processed signal by M samples in order to obtain shifted points and the calculation of the sum of the points of the spectrum of the processed signal and the shifted points. From the point of view of the signal, the shifting is a time delay.

The shifting is illustrated schematically in FIG. 2 by a box in which "$z^M$" is inscribed by way of reference to a technique of shifting by use of the Z transform.

A sum sign on which two incoming arrows are shown arriving, one corresponding to a path that passes through the box in which "$z^M$" is inscribed and the other corresponding to a path that does not pass there-through schematically shows the second operation of second processing.

The second channel 182 is also capable of carrying out a second operation of application of the inverse discrete Fourier transform to M points on the second selected points in order to obtain a second signal.

The second channel 182 is also capable of carrying out a second operation of third processing of the second signal in order to obtain a second output signal.

In this case, the second channel 182 is capable of carrying out of a frequency translation of a value equal to the opposite of the ratio between the frequency of sampling and the number 2*M.

Such an operation is symbolized by an arrow on a multiplier, this being an arrow on which is inscribed "$e^{j\pi n/m}$" by way of reference to a common used translation technique that consists of multiplying the signal by a complex exponential that is appropriately chosen.

The transmitter 183 is capable of transmitting the input signal on the first channel 181 and the second channel 182.

The mixer 184 is capable of recombining the first output signal and the second output signal in order to obtain the filtered signal.

In this case, since the recombination is achieved by computing a difference between the first output signal and the second output signal, the mixer 184 is represented by a circle with a + sign and a − sign.

The operation of the second filter 18 will now be described with reference made to an example of implementation of a signal filtering method for filtering a numerical input signal that is sampled at a sampling frequency in order to obtain a filtered signal.

The method includes a step of provision, a step of transmission, a signal obtaining step for obtaining a first output signal, a signal obtaining step for obtaining a second output signal, and a step of recombination.

During the step of provision, the input signal is supplied on the input terminal 18 of the second filter 18.

During the step of transmission, the input signal is transmitted by the transmitter 183 on the two channels 181 and 182.

During the signal obtaining step for obtaining the first output signal, it is necessary to calculate the fast Fourier transform at M points of the input signal in order to obtain the even order coefficients of a spectral analysis at 2*M points of the input signal.

Thereafter the process involves a first operation of carrying out the shifting of points of the spectrum of the processed signal by M samples in order to obtain shifted points and the calculation of the sum of points of the spectrum of the processed signal and the shifted points. The first selected points are thereby obtained.

This is then followed by a subsequent application of the inverse discrete Fourier transform to M points on the first selected points in order to obtain a first output signal.

The first output signal is sent to the transmitter 183.

During the step of obtaining the second output signal, it is necessary to carry out a frequency translation of a value equal to the ratio between the frequency of sampling and the number 2*M. A processed signal is thus obtained.

It is necessary to calculate the fast Fourier transform at M points of the processed signal in order to obtain the odd order coefficients of a spectral analysis at 2*M points of the input signal.

It is then necessary to carry out a second operation of implementation of the shifting of points of the spectrum of the processed signal by M samples in order to obtain shifted points and the calculation of the sum of points of the spectrum of the processed signal and the shifted points. The second selected points are thus obtained.

This is then followed by a subsequent application of the inverse discrete Fourier transform to M points on the second selected points in order to obtain a second signal.

This is then followed by subsequently carrying out the implementation of a frequency translation applied to the second signal of a value equal to the opposite of the ratio between the frequency of sampling and the number 2*M. This makes it possible to obtain an output signal.

The recombination step is then carried out with the use of the mixer 184 in order to obtain the filtered signal by computing the difference between the first output signal and the second output signal.

The method provides the ability to obtain a filtered signal in an easier manner.

Figure 5:
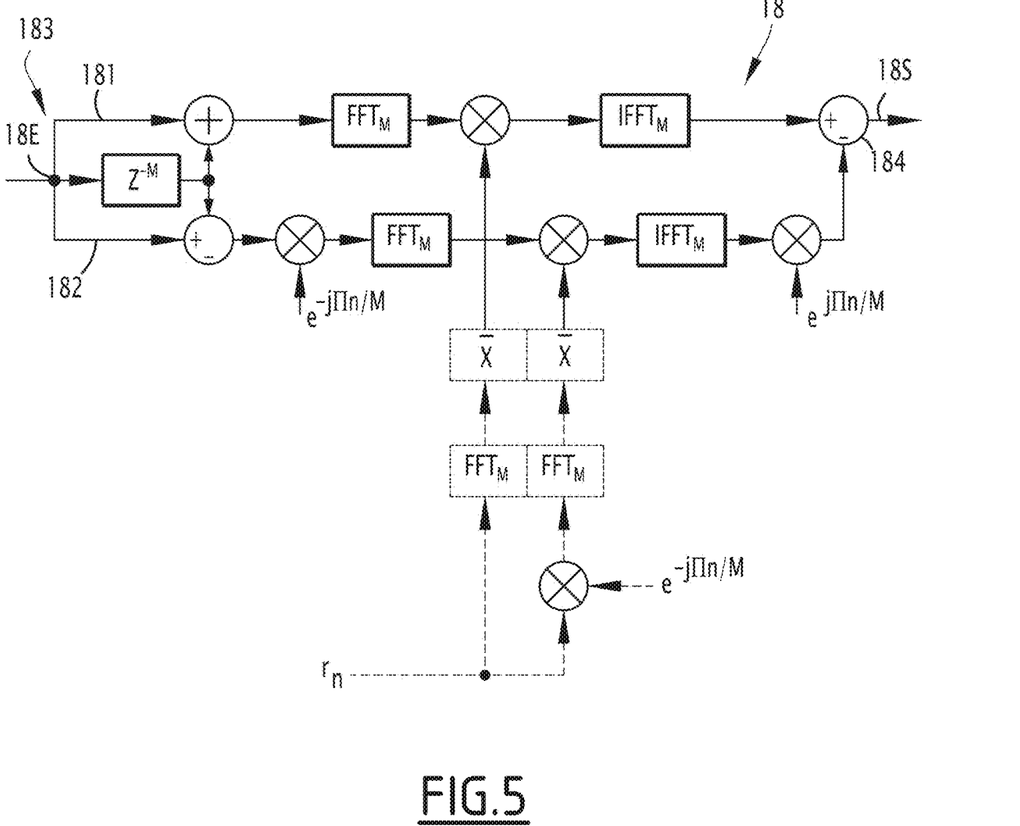
FIG. 5, a block diagram illustrating the proper operation of the filter shown in FIG. 4.

In fact, the said method, as compared to a method known in the state of the art, provides the ability to limit the memory space required by 40% as is demonstrated in commenting on FIG. 5.

In addition, it is also possible to consolidate the calculations since the two channels 181 and 182 are synchronous.

Figure 3:
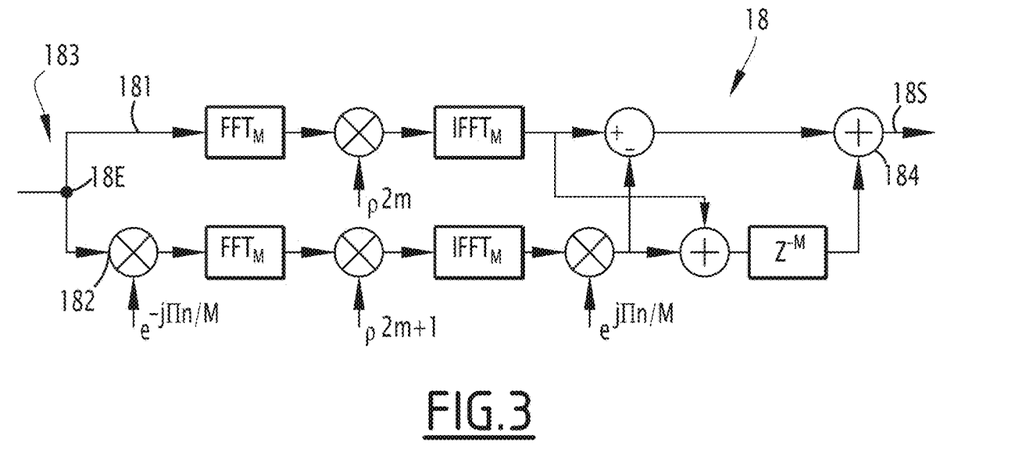
FIG. 3, a block diagram showing the operations carried out by another example of a filter.

By way of a variant, the second filter 18 is in accordance with the embodiment represented in FIG. 3.

The elements that are identical to those in the embodiment represented in FIG. 2 have not been described again. Only the differences have been highlighted.

The second filter 18 according to the embodiment represented in FIG. 3 differs from the second filter 18 according to the embodiment represented in FIG. 2 by way of the operations that first channel 181 and the second channel 182 are capable of carrying out and in terms of the nature of the operations carried out during the step of recombination.

In the case of FIG. 3, each of the first operations of first processing and second processing consists of transmitting the relevant signal being considered.

In the case of FIG. 3, the second operation of first processing includes the carrying out of a frequency translation of a value equal to the ratio between the frequency of sampling and the number 2*M.

The second processing consists of transmitting the relevant signal being considered.

The second operation of third processing includes the carrying out of a frequency translation applied to the second signal of a value equal to the opposite of the ratio between the frequency of sampling and the number 2*M.

During the step of recombination, calculation is performed to obtain the difference between the first output signal and the second output signal, in order to obtain a first calculation signal.

Calculation is then performed to obtain the sum of the first output signal and the second output signal in order to obtain a second intermediate calculation signal.

This is also accompanied by implementation of a shifting of the second intermediate calculation signal by M samples in order to obtain a second calculation signal.

Calculation is then also performed to obtain the sum of the first calculation signal and the second calculation signal in order to obtain the filtered signal.

The same advantages are applicable to the embodiment according to FIG. 3.

Figure 4:
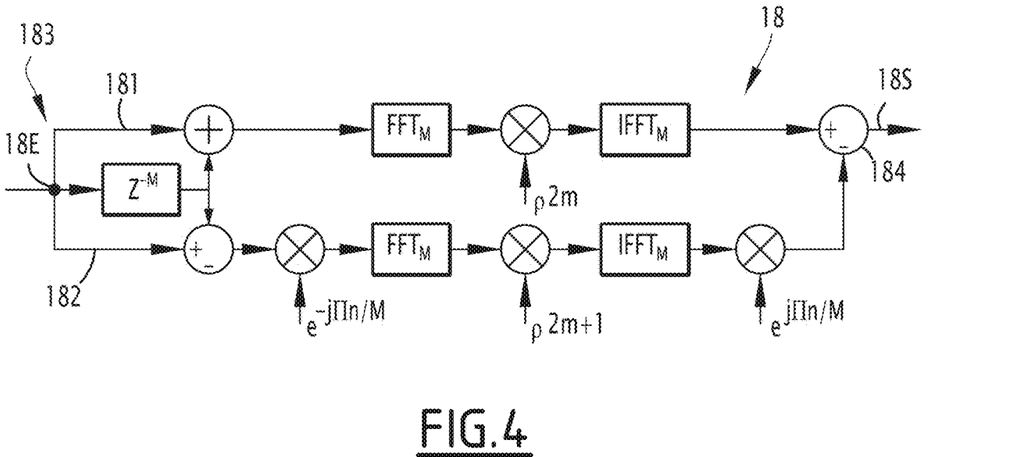
FIG. 4, a block diagram showing the operations carried out by yet another example of a filter.

According to another variant embodiment, the second filter 18 is in accordance with the embodiment represented in FIG. 4.

The elements that are identical to those in the embodiment represented in FIG. 2 have not been described again. Only the differences have been highlighted.

The second filter 18 according to the embodiment represented in FIG. 4 is different from the second filter 18 according to the embodiment represented in FIG. 2 by way of the operations that first channel 181 and the second channel 182 are capable of carrying out.

In the case of FIG. 4, the first operation of first processing implements the shifting of the input signal by M samples in order to obtain a shifted signal and the calculation of the sum of the input signal and the shifted signal.

Every first operation of second processing and third processing consists of transmitting the signal.

According to the example in FIG. 4, the second operation of first processing implements the shifting of the input signal by M samples in order to obtain a shifted signal and the calculation of the sum of the input signal and the shifted signal. The second operation of first processing then implements a frequency translation of a value equal to the ratio between the frequency of sampling and the number 2*M.

The second operation of second processing consists of transmitting the signal.

The second operation of third processing implements a frequency translation applied to the second signal of a value equal to the opposite of the ratio between the frequency of sampling and the number 2*M.

The same advantages are applicable to the embodiment according to FIG. 4.

In the section that follows, with reference being made to FIG. 5, it is shown that the proposed calculations provide the ability to obtain the desired filtering.

In order to compute a tranche of M output points, use is made of a tranche of 2 million points $a_n$ for indices n which, by convention, will be for example $0 \leq n \leq 2M-1$.

In order to understand the remainder of the calculation, it is necessary to explain the generalities with respect to the decomposition of a discrete Fourier transform (DFT) in Radix (x being the number of factorisable points).

The discrete Fourier transform at N points of a sequence of N points $x_n$ (where N is an integer) amounts to:

$$X_m = \sum_{n=0}^{N-1} x_n e^{-j2\pi \frac{n \times m}{N}}$$

In the case where N is the product $N = N_1 \, N \, x_2$ of two whole numbers or integers $N_1$ and $N_2$, it may be written as follows:

$$X_{m_1 N_2 + m_2} = \sum_{n_1=0}^{N_1-1} \sum_{n_2=0}^{N_2-1} x_{n_2 N_1 + n_1} e^{-j2\pi \frac{(n_2 N_1 + n_1) \times (m_1 N_2 + m_2)}{N_1 N_2}} =$$

$$\sum_{n_1=0}^{N_1-1} \sum_{n_2=0}^{N_2-1} x_{n_2 N_1 + n_1} e^{-j2\pi \frac{n_1 \times m_2}{N_1 N_2}} e^{-j2\pi \frac{n_1 \times m_1}{N_1}} e^{-j2\pi \frac{n_2 \times m_2}{N_2}}$$

There are two ways of decomposing the discrete Fourier transform, the two ways corresponding to the cascade of a discrete Fourier transform at $n_1$ points and a discrete Fourier transform at $n_2$ points. This is the order to be followed for performing these differing discrete Fourier transforms.

One of the discrete Fourier transforms that is implemented is weighted by a local oscillator that is used to perform an end shifting of the spectrum the exponential term that makes possible this translation is known as "twiddle factor":

$$\text{twiddle factor} = e^{-j2\pi \frac{n_1 \times m_2}{N_1 N_2}}$$

In principle, the fastest varying output index is $m_1$ since it corresponds to the 'fast' discrete Fourier transform that is to say not multiplexed. Thus, the output order of the frequencies is not the natural order: in fact, first to be output are the m's having a value of 0 modulo $N_1$ then the m's having a value of 1 and so on until the m's having a value of $N_1-1$ still with 0 modulo $N_1$, this order is known as "bit reverse" because this corresponds to reversing the binary representation of the index in order to obtain the output tier (for a number of power of 2 points).

The execution of the inverse discrete Fourier transform, which retrieves the frequency data in "bit reverse", is carried out in a dual manner, by reversing the operations.

According to a first case, the discrete Fourier transform at $N_1$ points ("fast") is followed of the Fourier transform at $N_2$ points ("multiplexed"), which corresponds to:

$$X_{m_1 N_2 + m_2} = \sum_{n_1=0}^{N_1-1} \sum_{n_2=0}^{N_2-1} x_{n_2 N_1 + n_1} e^{-j2\pi \frac{(n_2 N_1 + n_1) \times (m_1 N_2 + m_2)}{N_1 N_2}} =$$

$$\underbrace{\sum_{n_2=0}^{N_2-1} e^{-j2\pi + \frac{n_2 \times m_2}{N_2}} \times \underbrace{\sum_{n_1=0}^{N_1-1} e^{-j2\pi \frac{n_1 \times m_1}{N_1}} \underbrace{e^{-j2\pi \frac{n_1 \times m_2}{N_1 N_2}}}_{\text{twiddle factor}} \times x_{n_2 N_1 + n_1}}_{\text{FFT at } N_1 \text{ points (Radix} N_1)}}_{\substack{\text{FFT at } N_1 \text{ points} \\ \text{multiplexed by } N_1 \\ (\text{Radix} N_2)}}$$

The execution of the Fourier transform is carried out as the cascade of a Fourier transform at $N_1$ points that is not multiplexed and a Fourier transform at $N_2$ points that is multiplexed by $N_1$. The "twiddle factor" is placed on top in front of the first stage of Fourier transform.

According to a second case, the discrete Fourier transform at $N_2$ points ("multiplexed") is followed by the Fourier transform at $N_1$ points ("fast"), which corresponds to:

$$X_{m_1 N_2 + m_2} = \sum_{n_1=0}^{N_1-1} \sum_{n_2=0}^{N_2-1} x_{n_2 N_1 + n_1} e^{-j2\pi \frac{(n_2 N_1 + n_1) \times (m_1 N_2 + m_2)}{N_1 N_2}} =$$

$$\underbrace{\sum_{n_1=0}^{N_1-1} e^{-j2\pi \frac{n_1 \times m_1}{N_1}} \times \underbrace{e^{-j2\pi \frac{n_1 \times m_2}{N_1 N_2}}}_{\text{twiddle factor}} \underbrace{\sum_{n_2=0}^{N_2-1} e^{-j2\pi + \frac{n_2 \times m_2}{N_2}} x_{n_2 N_1 + n_1}}_{\substack{\text{FFT at } N_2 \text{ points} \\ \text{multiplexed by } N_1 \\ (\text{Radix} N_2)}}}_{\substack{\text{FFT at } N_1 \text{ points} \\ (\text{Radix} N_1)}}$$

The execution of the Fourier transform is carried out this time as the cascade of a discrete Fourier transform at $N_2$ points that is multiplexed by $N_1$ and a discrete Fourier transform at $N_1$ points that is not multiplexed. The "twiddle factor" is placed between the two stages of discrete Fourier transform. The first discrete Fourier transform carried out being multiplexed, this decomposition is adapted to parallelized input data the multiplexing thus then is transformed into parallel processing.

According to one of the conventional versions of decomposition in radix2, the FFT at 2 M points of this suite $a_n$ is written as:

$$b_m = \sum_{n=0}^{2M-1} a_n e^{-j2\pi nm/(2M)} = \sum_{n=0}^{M-1} a_n e^{-j2\pi nm/(2M)} + (-1)^m \sum_{n=0}^{M-1} a_{M+n} e^{-j2\pi nm/(2M)}$$

In particular:

$$b_{2m+p} =$$
$$\sum_{n=0}^{M-1} a_n e^{-j2\pi np/(2M)} e^{-j2\pi nm/M} + (-1)^p \sum_{n=0}^{M-1} a_{M+n} e^{-j2\pi np/(2M)} e^{-j2\pi nm/M}$$

Where $p = \begin{cases} 0 \\ 1 \end{cases}$

That is:

$$b_{2m+p} = FFT_M(a_n e^{-j\pi np/M}) + (-1)^p FFT_M(a_{M+n} e^{-j\pi np/M})$$

where $FFT_M$ denotes the FFT at M points.

It is to be noted that this spectral density is also written in the two following ways that will serve to simplify the implementation thereof:

$$b_{2m+p} = FFT_M(a_n e^{-j\pi np/M}) + FFT_M(a_{M+n} e^{-j\pi(m+n)p/M})$$

and $$b_{2m+p} = FFT_M([(-1)^p a_n + a_{M+n}] e^{-j\pi(M+n)p/M})$$

By denoting as $\rho_m$ the spectral response of the filter, the response filtered by inverse transformation is obtained as follows:

$$c_k = \sum_{p=0}^{1} \sum_{m=0}^{M-1} b_{2m+p} \rho_{2m+p} e^{j2\pi k(2m+p)/(2M)} =$$

$$\sum_{p=0}^{1} e^{j2\pi kp/(2M)} \sum_{m=0}^{M-1} b_{2m+p} \rho_{2m+p} e^{j2\pi km/M}$$

The response is calculated only for the points $0 \le k \le M-1$ (on account of the aliasing inherent in the FFT) in order to finally obtain:

$$c_k = \sum_{p=0}^{1} e^{j\pi kp/M} IFFT_M(b_{2m+p} \rho_{2m+p})$$

where the $IFFT_M$ denotes the inverse FFT at M points.

The formulas giving $b_{2m+p}$ and $c_k$ it is possible to obtain the preceding block diagrams that provide the ability to perform convolutions with responses of twice the size by using the same size of FFT and IFFT, by means of saving to memory once on M points.

The block diagram shown in FIG. 2 is thus then obtained. Such a block diagram corresponds to the first formulation of the spectral density $b_{2m+p}$.

By moving the save-memory function towards the output it is possible to reduce it by half, which results in the block diagram shown in FIG. 3.

Finally, the moving of the save-memory function towards the input, which corresponds to the second formulation of the spectral density $b_{2m+p}$, results in the block diagram shown in FIG. 4 which can be considered as a dual version of the block diagram represented in FIG. 3.

The operations involved in these block diagrams correspond to the first tier (for the FFT) or the last tier (for the IFFT) of "twiddle factors" not taken into account, in principle, in the FFT at M points. Theoretically, these digital operations are to be reinitialised at each frame of FFT.

It is however to be noted that this is in fact not necessary in practice because, in the absence of reinitialisation, the sign of these operations changes at each frame, so that the two sign changes offset each other.

It may be demonstrated that such filtering is more economical in terms of memory resources in the event where a floating-point implementation is required.

When the filtering corresponds to the filtering adapted to a given signal (a pulse received for example), the complex gain of the matched filter is the conjugate of the pulse spectrum. If this spectrum is obtained by FFT at 2M points of a pulse starting at n=0 and ending before n=M, then the time response of the matched filter thus happens to be placed in the negative time.

If $r_n$ is the impulse and if $x_n$ is the signal received, the matched filtering carries out the following operation, which is the calculation of the autocorrelation of the pulse when the received signal $x_n$ is equal to the pulse $r_n$, with the correlation peak arriving at the beginning of the pulse:

$$y_q = \sum_{k=0}^{M-1} r_k^* x_{q+k}$$

The conjugate of the complex gain of the matched filter is as follows:

$$\begin{cases} \rho_{2m}^* = \sum_{n=0}^{2M-1} r_n e^{-j2\pi n(2m)/(2M)} = \sum_{n=0}^{M-1} r_n e^{-j2\pi nm/M} + \sum_{n=0}^{M-1} r_{M+n} e^{-j2\pi nm/M} \\ \rho_{2m+1}^* = \sum_{n=0}^{2M-1} r_n e^{-j2\pi n(2m+1)/(2M)} = \sum_{n=0}^{M-1} r_n e^{-j2\pi n/(2M)} e^{-k2\pi nm/M} - \sum_{n=0}^{M-1} r_{M+n} e^{-j2\pi n/(2M)} e^{-j2\pi nm/M} \end{cases}$$

Given that the impulse is zero for negative times, the result that is then obtained of two FFT at M points is:

$$\rho_{2m}^* = \sum_{n=0}^{M-1} r_n e^{-j2\pi nm/M}$$

and $$\rho_{2m+1}^* = \sum_{n=0}^{M-1} r_n e^{-j\pi n/M} e^{-j\pi nm/M}$$

This leads to the verification block diagram shown in FIG. 5 having a more symmetrical view that makes it possible to verify directly that each implementation of the second filter 18 effectively enables the achievement of the desired result.

At the input of the IFFT of the first channel 181, the following is obtained:

$$\sum_{n=0}^{M-1} \xi_n e^{-j2\pi nm/M} \sum_{k=0}^{M-1} r_k^* e^{+j2\pi km/M} =$$

$$\sum_{n=0}^{M-1} \sum_{k=0}^{M-1} \xi_n r_k^* e^{-j2\pi qm/M} = \sum_{q=0}^{M-1} e^{-j2\pi qm/M} \sum_{n=0}^{M-1} \xi_n r_{mod(n-q,M)}^*$$

At the output of this IFFT of the first channel 181, the following is obtained:

$$\sum_{n=0}^{M-1} \xi_n r_{mod(n-q,M)}^*$$

For the second channel 182, at the input of the IFFT, the following is obtained:

$$\sum_{n=0}^{M-1} \xi_n e^{-j2\pi n/M} e^{-j2\pi nm/M} \sum_{k=0}^{M-1} r_k^* e^{+j2\pi k/M} e^{+j2\pi km/M} =$$

$$\sum_{k-n=-n}^{-n+M-1} \sum_{n=0}^{M-1} \xi_n r_k^* e^{-j\pi(n-k)/M} e^{-j2\pi(n-k)m/M}$$

These last equations may be written as follows:

$$\sum_{n-k=n+1-M}^{n} \sum_{n=0}^{M-1} \xi_n r_k^* e^{-j\pi(n-k)/M} e^{-j2\pi(n-k)m/M} =$$

$$\sum_{q=0}^{M-1} e^{-j\pi j/M} e^{-j2\pi jm/M} \sum_{n=0}^{M-1} \xi_n r_{mod(n-q,M)}^* sign(n-q)$$

où $sign(n-q) = \begin{cases} -1 & \text{si } n < q \\ +1 & \text{si } n \geq q \end{cases}$ At the output of this IFFT of the second channel 182, and after multiplication by the "twiddle factor", the following is obtained:

$$\sum_{n=0}^{M-1} \xi_n r_{mod(n-q,M)}^* sign(n-q)$$

However:
on the upper channel: $\xi_n = x_n + x_{n-M}$
on the lower channel: $\xi_n = x_n - x_{n-M}$
The overall output thus is:

$$y_q = \sum_{n=0}^{M-1} r_{mod(n-q,M)}^* \times [(x_n + x_{n-M}) - (x_n - x_{n-M}) \times sign(n-q)]$$

That is to say:

$$y_q = 2 \times \left( \sum_{n=0}^{q-1} x_n r_{mod(n-q,M)}^* + \sum_{n=1}^{M-1} x_{n-M} r_{mod(n-q,M)}^* \right) =$$

$$2 \times \left( \sum_{n=0}^{q-1} x_n r_{n-q,M}^* + \sum_{n=1}^{M-1} x_{n-M} r_{n-q}^* \right)$$

Which is:

$$y_q = 2 \times \left( \sum_{n=0}^{q-1} x_n r_{n-q+M}^* + \sum_{n=q-M}^{-1} x_n r_{n-q+M}^* \right) =$$

$$2 \sum_{n=q-M}^{q-1} x_n r_{n-q+M}^* = 2 \sum_{k=0}^{M-1} r_k^* x_{q+k-M}$$

In fact, it has been shown that the desired result is obtained at a time shift of M points (ensuring the causality of the process) and to within a multiplicative factor of 2:

$$y_{q+M} = 2 \sum_{k=0}^{M-1} r_k^* x_{q+k}$$

This demonstration carried out for the block diagram shown in FIG. 4 converts easily for the two other block diagram shown in the FIGS. 2 and 3.

In any case, this reasoning shows that the major interest of the proposed method is the economy of memory resources. In fact, an FFT requires a depth of memory storage that is equal to its size.

In the case of a method according to the state of the art, the required memory space is therefore equal to four times the resources required for a FFT (2 FFT and 2 IFFT): 4×2M=8M points. In contrast, in the case of the proposed method, the FFTs being half the size, the size required by the FFTs and IFFTs therefore drops to 4M points to which should be added M points for effecting the specific memory save performed at the top this corresponds to a computation of 5M points. The savings in memory storage space achieved is therefore close to 40%.

The second interesting benefit of the proposed method lies in the fact that the two channels 181 and 182 are synchronous, whereas these channels are shifted by a half frame in the case of a method according to the state of the art. Indeed, if the twiddle factors of the FFT and the IFFT are calculated instead of being stored in the tables (which is desirable for FFT of large sizes), this provides the ability to consolidate this computation between the two channels 181 and 182 of the method, whereas this was not possible in a method according to the state of the art.

In other words, it has been demonstrated that the proposed method makes possible the easier implementation of filtering of a numerical input signal.

The invention claimed is:

1. A signal filtering method for filtering a numerical input signal that is sampled at a sampling frequency in order to obtain a filtered signal, the method comprising:
    obtaining an input signal;
    transmitting the input signal over two channels;
    obtaining a first output signal through first operations on a first channel of the two channels including:
        first operation first processing of the input signal in order to obtain a first operation processed signal,
        applying a discrete Fourier transform to M points on the first operation processed signal in order to obtain M points of the spectrum of the first operation processed signal, M being an integer that is 3 or greater, each point of the spectrum of the first operation processed signal corresponding to even-numbered indices of a spectral analysis at 2*M points of the first operation processed signal and being indicated in a bijective manner by an index k, k being an even number occurring between 0 and 2*M−1,
        first operation second processing of the points of the spectrum of the first operation processed signal in order to obtain first selected points,
        applying an inverse discrete Fourier transform to M points on the first selected points in order to obtain a first signal, and
        first operation third processing of the first signal in order to obtain the first output signal,
    obtaining a second output signal through second operations on a second channel of the two channels including:
        second operation first processing of the input signal in order to obtain a second operation processed signal,
        applying the discrete Fourier transform to M points on the second operation processed signal in order to obtain M points of the spectrum of the second operation processed signal, M being an integer that is 3 or greater, each point of the spectrum of the second operation processed signal corresponding to odd-numbered indices of a spectral analysis at 2*M points of the second operation processed signal and being indicated in a bijective manner by an index k, with k being an odd number occurring between 0 and 2*M−1,
        second operation second processing of the points of the spectrum of the second operation processed signal in order to obtain the second selected points,
        applying the inverse discrete Fourier transform to M points on the second selected points in order to obtain a second signal, and
        second operation third processing of the second signal in order to obtain the second output signal; and
    recombining the first output signal and the second output signal in order to obtain the filtered signal.

2. The signal filtering method according to claim 1, wherein:
    the second operation first processing includes carrying out a first frequency translation of a value equal to a ratio between a frequency of sampling and the number 2*M, and
    the second operation third processing includes carrying out a second frequency translation applied to the second signal of a value equal to an opposite of the ratio between the frequency of sampling and the number 2*M.

3. The signal filtering method according to claim 1, wherein:
    the first operation second processing includes shifting of points of the spectrum of the first operation processed signal by M samples in order to obtain shifted points and calculating a sum of points of the spectrum of the first operation processed signal and the shifted points, and
    the second operation second processing includes shifting of points of the spectrum of the second operation processed signal by M samples in order to obtain shifted points and calculating a sum of points of the spectrum of the second operation processed signal and the shifted points.

4. The signal filtering method according to claim 1, wherein:
    the first operation first processing includes shifting of the input signal by M samples in order to obtain a first shifted signal and calculating a sum of the input signal and the first shifted signal, and
    the second operation first processing includes shifting of the input signal by M samples in order to obtain a second shifted signal and calculating a difference between the input signal and the second shifted signal.

5. The signal filtering method according to claim 1, wherein the recombining is carried out by calculating a difference between the first output signal and the second output signal.

6. The signal filtering method according to claim 1, wherein the recombining is carried out by:
    calculating a difference between the first output signal and the second output signal, in order to obtain a first calculation signal,
    calculating a first sum of the first output signal and the second output signal in order to obtain a second intermediate calculation signal,
    shifting the second intermediate calculation signal by M samples in order to obtain a second calculation signal, and
    calculating a second sum of the first calculation signal and the second calculation signal in order to obtain the filtered signal.

7. A filter configured to filter a numerical input signal that is sampled at a sampling frequency in order to obtain a filtered signal, the filter comprising:
    an input terminal configured to receive an input signal;
    a first channel configured to obtain a first output signal through first operations;
    a second channel configured to obtain a second output signal through second operations;
    a transmitter configured to transmit the input signal on the first channel and the second channel;
    a mixer configured to recombine the first output signal and the second output signal in order to obtain the filtered signal;
    the first channel implementing first operations including:
        first operation first processing of the input signal in order to obtain a first operation processed signal,
        applying a discrete Fourier transform to M points on the first operation processed signal in order to obtain M points of the spectrum of the first operation processed signal, M being an integer that is 3 or greater, each point of the spectrum of the first operation processed signal corresponding to even-numbered indices of a spectral analysis at 2*M points of the first operation processed signal and being indicated in a bijective manner by an index k, k being an even number occurring between 0 and 2*M−1, first operation second processing of the points of the spectrum of the first operation processed signal in order to obtain first selected points, applying an inverse discrete Fourier transform to M points on the first selected points in order to obtain a first signal, and first operation third processing of the first signal in order to obtain the first output signal, and the second channel implementing second operations including:

second operation first processing of the input signal in order to obtain a second operation processed signal, applying the discrete Fourier transform to M points on the second operation processed signal in order to obtain M points of the spectrum of the second operation processed signal, M being an integer that is 3 or greater, each point of the spectrum of the second operation processed signal corresponding to odd-numbered indices of a spectral analysis at 2*M points of the second operation processed signal and being indicated in a bijective manner by an index k, k being an odd number occurring between 0 and 2*M−1, second operation second processing of the points of the spectrum of the second operation processed signal in order to obtain the second selected points, applying the inverse discrete Fourier transform to M points on the second selected points in order to obtain a second signal, and second operation third processing of the second signal in order to obtain the second output signal.

8. A processing chain that comprises at least one of the filter according to claim 7.

9. The processing chain according to claim 8, wherein the processing chain is a programmable logic circuit or an application-specific integrated circuit.

10. A radar comprising:

the processing chain according to claim 8.

* * * * *